(12) United States Patent
Tu et al.

(10) Patent No.: US 12,095,231 B2
(45) Date of Patent: Sep. 17, 2024

(54) VERTICAL-CAVITY SURFACE-EMITTING LASER AND METHOD FOR FORMING THE SAME

(71) Applicant: WIN SEMICONDUCTORS CORP., Taoyuan (TW)

(72) Inventors: Min-Chang Tu, Taoyuan (TW); Jiun-Tsuen Lai, Taoyuan (TW); Wan-Ting Chien, Taoyuan (TW)

(73) Assignee: WIN SEMICONDUCTORS CORP., Taoyuan (TW)

( * ) Notice: Subject to any disclaimer, the term of this patent is extended or adjusted under 35 U.S.C. 154(b) by 555 days.

(21) Appl. No.: 17/212,214

(22) Filed: Mar. 25, 2021

(65) Prior Publication Data

US 2022/0311212 A1    Sep. 29, 2022

(51) Int. Cl.
   *H01S 5/183* (2006.01)

(52) U.S. Cl.
   CPC ...... *H01S 5/18377* (2013.01); *H01S 5/18372* (2013.01); *H01S 5/18394* (2013.01)

(58) Field of Classification Search
   CPC ........ H01S 5/18; H01S 5/183; H01S 5/18311; H01S 5/18333; H01S 5/18336; H01S 5/18347; H01S 5/18358; H01S 5/18308; H01S 5/18344; H01S 5/18361; H01S 5/18377; H01S 5/18394; H01S 5/42–423
   See application file for complete search history.

(56) References Cited

U.S. PATENT DOCUMENTS

| | | | |
|---|---|---|---|
| 5,468,656 A | 11/1995 | Shieh et al. | |
| 10,574,031 B2 | 2/2020 | Barve et al. | |
| 2004/0264541 A1* | 12/2004 | Wang | H01S 5/18313 372/99 |
| 2007/0217472 A1 | 9/2007 | Collins et al. | |
| 2017/0310086 A1* | 10/2017 | Barve | H01S 5/18311 |
| 2020/0403377 A1 | 12/2020 | Wu et al. | |
| 2021/0399525 A1* | 12/2021 | Zhao | H01S 5/3416 |

(Continued)

FOREIGN PATENT DOCUMENTS

| | | |
|---|---|---|
| TW | 353821 B | 3/1999 |
| TW | 200737630 A | 10/2007 |
| TW | 201830811 A | 8/2018 |

(Continued)

OTHER PUBLICATIONS

Chinese language office action dated Mar. 25, 2022, issued in application No. TW 110131422.

*Primary Examiner* — Xinning(Tom) Niu
*Assistant Examiner* — Delma R Forde
(74) *Attorney, Agent, or Firm* — McClure, Qualey & Rodack, LLP

(57) ABSTRACT

A vertical cavity surface emitting laser includes an active area, an inner trench, an outer trench, and a first implantation region. The active area includes a first mirror, an active region, a second mirror, and an etch stop layer. The first mirror is formed over a substrate. The active region is formed over the first mirror. The second mirror is formed over the active region. The etch stop layer with an aperture is formed between the active region and the second mirror. The inner trench surrounds the active area in a top view. The outer trench is formed beside the inner trench. The first implantation region is formed below the inner trench.

19 Claims, 10 Drawing Sheets

(56) References Cited

U.S. PATENT DOCUMENTS

2022/0416512 A1\* 12/2022 Yang .................. H01S 5/18383
2023/0261443 A1\*  8/2023 Peters ................. H01S 5/3407
                                                    372/45.01

FOREIGN PATENT DOCUMENTS

TW      202046589 A    12/2020
TW      202101845 A     1/2021

\* cited by examiner

VERTICAL-CAVITY SURFACE-EMITTING LASER AND METHOD FOR FORMING THE SAME

BACKGROUND

Technical Field

The disclosure relates to a semiconductor structure, and more particularly to a vertical-cavity surface-emitting laser (VCSEL) and a method for forming a VCSEL.

Description of the Related Art

A vertical-cavity surface-emitting laser (VCSEL) is a semiconductor laser diode whose laser beam is emitted in the direction perpendicularly to its surface. VCSEL may be tested during production. VCSEL is widely adopted for use in various applications, such as optical fiber communications and biometrics.

The mesa of the active area of a VCSEL may be isolated by trenches. The power performance of a VCSEL may be affected by the depth of the trench. However, the depth of the trench varies within a wafer of 6 inches or beyond. In addition, an implantation region may be formed to isolate the emitter area of a VCSEL. However, if the implantation region is too deep, higher photo resistor and wider photo resistor spacing is needed. Therefore, the chip design may be limited.

Although existing VCSEL have generally been adequate for their intended purposes, they have not been entirely satisfactory in all respects, and need to be improved. This is especially true of the improvement of uniformity and chip design window.

BRIEF SUMMARY

The present disclosure provides a VCSEL includes an active area, an inner trench, an outer trench, and a first implantation region. The active area includes a first mirror, an active region, a second mirror, and an etch stop layer. The first mirror is formed over a substrate. The active region is formed over the first mirror. The second mirror is formed over the active region. The etch stop layer with an aperture is formed between the active region and the second mirror. The inner trench surrounds the active area in a top view. The outer trench is formed beside the inner trench. The first implantation region is formed below the inner trench.

The present disclosure also provides a VCSEL including an active region sandwiched between a first mirror and a second mirror. An etch stop layer is formed between the active region and the second mirror. An outer trench is formed through the second mirror, the etch stop layer, the active region, and the first mirror. An inner trench is formed through the second mirror. A first implantation region is formed under the inner trench. A second implantation region is formed under the outer trench. The bottom surface of the inner trench is level with the etch stop layer.

The present disclosure also provides a method for forming a VCSEL. The method includes a first mirror over a substrate. The method also includes forming an active region over the first mirror. The method also includes forming a second mirror over the active region. The method also includes forming an outer trench in the first mirror, the active region, and the second mirror. The method also includes oxidizing a spacer layer between the active region and the second mirror to form an etch stop layer at the top surface of the spacer layer. The method also includes forming an inner trench stopping on the etch stop layer. The method also includes forming a first implantation region under the inner trench.

A detailed description is given in the following embodiments with reference to the accompanying drawings.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
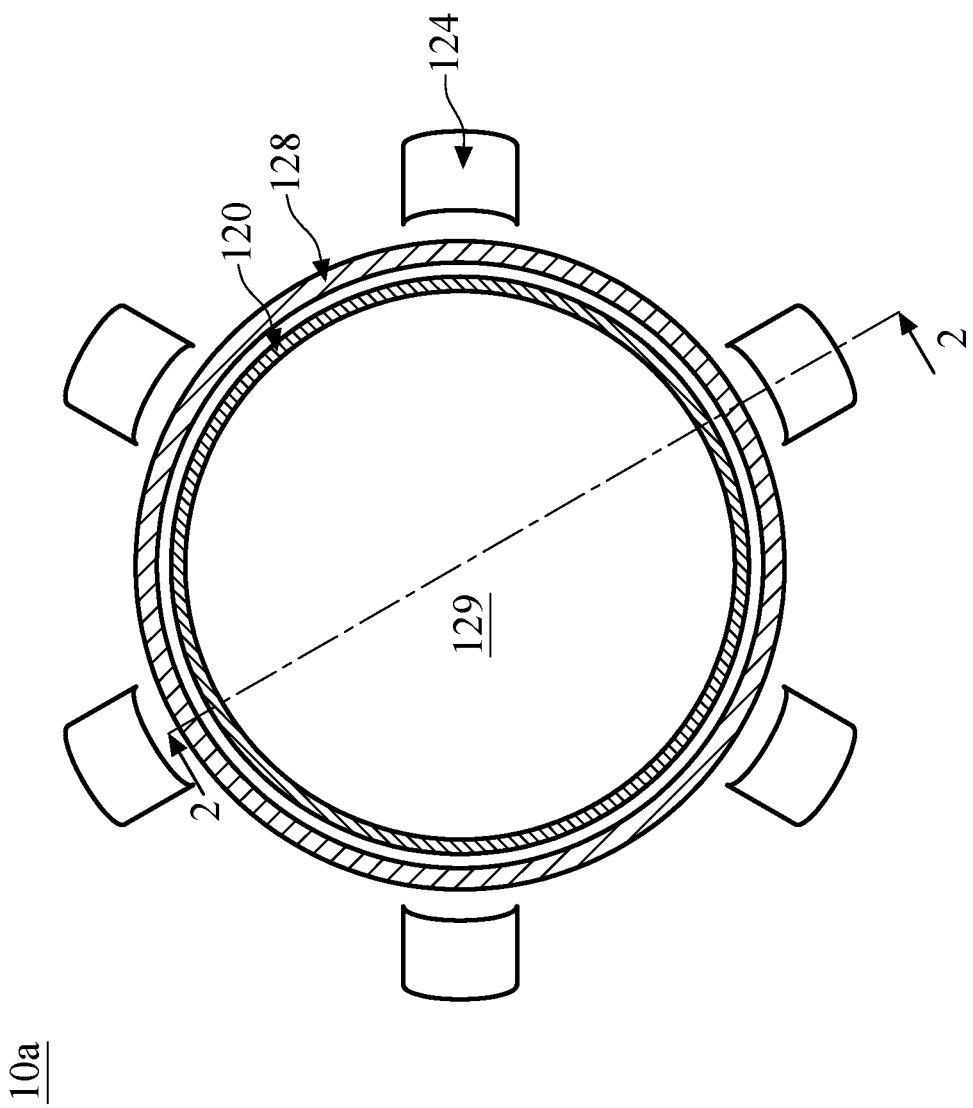
FIG. 1 is a top view of a VCSEL in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Although some embodiments are discussed with operations performed in a particular order, these operations may be performed in another logical order. In different embodiments, additional operations can be provided before, during, and/or after the stages described the present disclosure. Some of the stages that are described can be replaced or eliminated for different embodiments. Additional features can be added to the semiconductor structure in the present disclosure. Some of the features described below can be replaced or eliminated for different embodiments.

The embodiments of the present disclosure provide a vertical cavity surface emitting laser (VCSEL). The oxidation layer can be used as an etch stop layer, so that an extra trench surrounding the active area of the VCSEL is formed with well-controlled trench depth. Therefore, the depth uniformity of the extra trench can be improved. In addition, an implantation region is formed below the extra trench to vertically isolate the device. Since lower implantation energy is needed, the thickness and the spacing of the photo resistor of forming the implantation region may be reduced. Therefore, the design window may be improved.

FIG. 1 is a top view of a VCSEL 10a in accordance with some embodiments. FIGS. 2A-2E are cross-sectional representations of various stages of forming a VCSEL 10a in accordance with some embodiments. The FIGS. 2A-2E show cross-sectional representations taken along line 2-2 in FIG. 1.

Figure 2A:
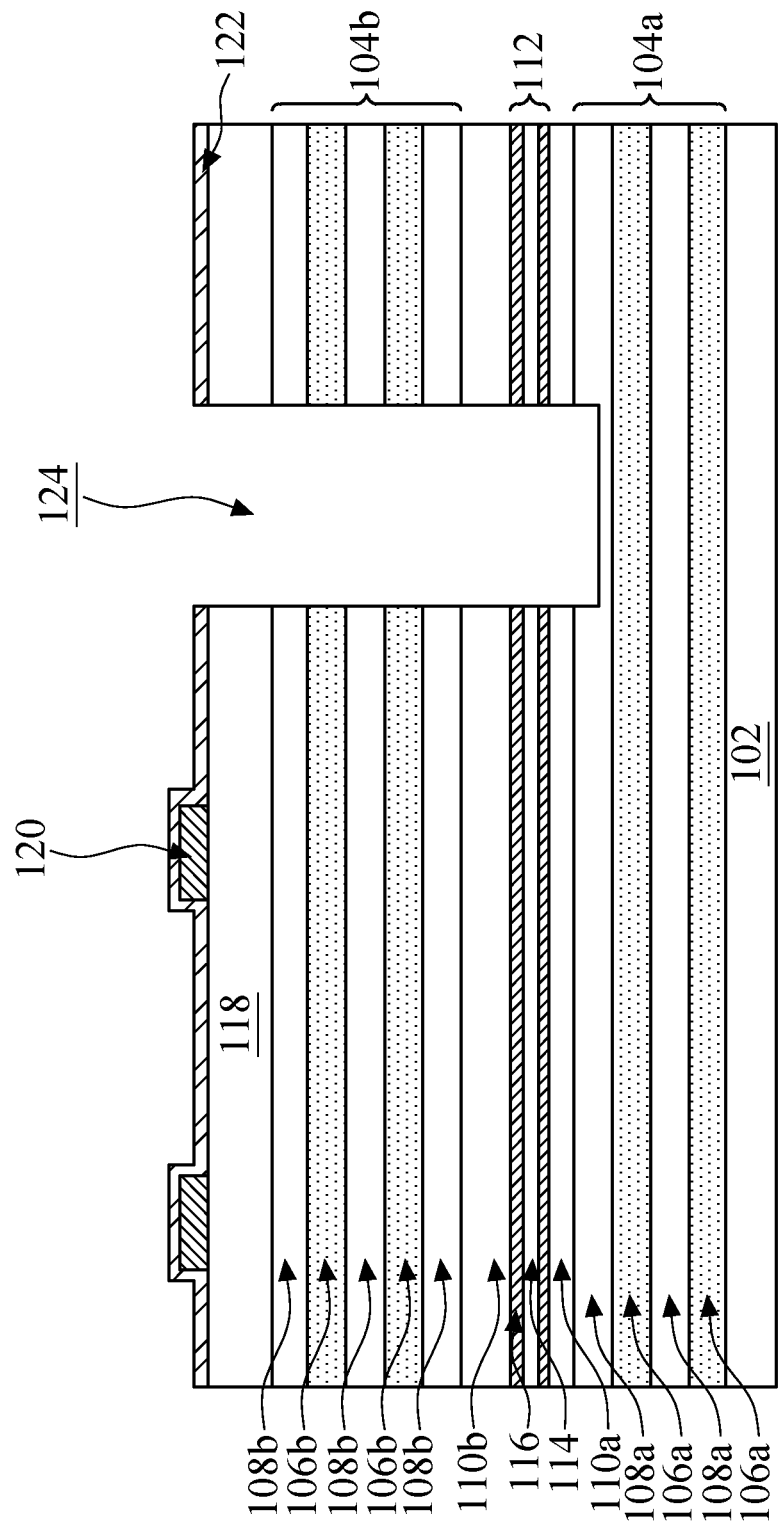
FIGS. 2A-2E are cross-sectional representations of various stages of forming a VCSEL in accordance with some embodiments.

A substrate 102 is provided, as shown in FIG. 2A in accordance with some embodiments. The substrate 102 may be a semiconductor substrate. The substrate 102 may include III-V semiconductors, such as GaAs, GaN, AlGaN, AlN, AlGaAs, InP, InAlAs, InGaAs, or a combination thereof. In some embodiments, the substrate 102 includes GaAs.

Next, a first mirror 104a is formed over the substrate 102, as shown in FIG. 2A in accordance with some embodiments. The first mirror 104a includes first semiconductor layers 106a and second semiconductor layers 108a. The first mirror 104a is stacked alternately with the first semiconductor layer 106a and the second semiconductor layer 108a over the substrate 102. The first semiconductor layer 106a and the second semiconductor layer 108a are used in pairs. The first semiconductor layers 106a and the second semiconductor layers 108a may include III-V semiconductors, such as GaAs, AlGaAs, AlAs, GaN, AlGaN, AlN, InP, InAlAs, InGaAs, or a combination thereof. The first semiconductor layers 106a and the second semiconductor layers 108a may be made of different materials with different refractive indexes. In some embodiments, the first semiconductor layers 106a and the second semiconductor layers 108a have a first conductivity type. In some embodiments, the first conductivity type is N-type. The first mirror 104a may be referred to as a distributed Bragg reflector (DBR) of a first conductivity type. The thickness of each layer of the first semiconductor layers 106a and the second semiconductor layers 108a depends on the center wavelength of laser light generated in the VCSEL. The first semiconductor layers 106a and the second semiconductor layers 108a may be formed by low pressure chemical vapor deposition (LPCVD) process, epitaxial growth process, other applicable methods, or a combination thereof. The epitaxial growth process may include molecular beam epitaxy (MBE), metal organic chemical vapor deposition (MOCVD), or vapor phase epitaxy (VPE).

It should be noted that, although there are only two pairs of the first semiconductor layers 106a and second semiconductor layers 108a stacked alternately as shown in FIG. 2A, the total number of such pairs of the first semiconductor layers 106a and the second semiconductor layers 108a are not limited herein, depending on the demand of design.

Next, a first spacer 110a is formed over the first mirror 104a, as shown in FIG. 2A in accordance with some embodiments. The first spacer 110a may include a III-V semiconductor with a gradient refractive indexes. The first spacer 110a may include III-V semiconductors such as GaAs, AlGaAs, AlAs, GaN, AlGaN, AlN, InP, InAlAs, InGaAs, or a combination thereof. In some embodiments, the first spacer 110a has a first conductivity type. In some embodiments, the first conductivity type is N-type. The dopant concentration of the first spacer 110a may be less than the dopant concentration of the first semiconductor layers 106a and the second semiconductor layers 108a. The first spacer 110a may be multiple III-V semiconductor layers with different dopants and doping concentrations. The first spacer 110a may be formed by a low pressure chemical vapor deposition (LPCVD) process, epitaxial growth process, other applicable methods, or a combination thereof. The epitaxial growth process may include molecular beam epitaxy (MBE), metal organic chemical vapor deposition (MOCVD), or vapor phase epitaxy (VPE).

Afterwards, an active region 112 is formed over the first spacer 110a, as shown in FIG. 2A in accordance with some embodiments. The active region 112 may include a number of quantum wells 114 and quantum well barriers 116. The quantum wells 114 and the quantum well barriers 116 may include III-V semiconductors such as GaAs, AlGaAs, AlAs, GaN, AlGaN, AlN, InP, InAlAs, InGaAs, or a combination thereof. The quantum wells 114 and the quantum well barriers 116 may be made of different materials, and the quantum well barriers 116 may have a greater energy band gap than the quantum wells 114. The active region 112 may generate the optical power for the VCSEL. The active region 112, including the quantum wells 114 and the quantum well barriers 116, may be formed by a low pressure chemical vapor deposition (LPCVD) process, an epitaxial growth process, other applicable methods, or a combination thereof. The epitaxial growth process may include molecular beam epitaxy (MBE), metal organic chemical vapor deposition (MOCVD), or vapor phase epitaxy (VPE). The active region 112 may separate the underlying first mirror 104a, the first spacer 110a, and the subsequently formed second spacer and second mirror.

Next, a second spacer 110b is formed over the active region 112, as shown in FIG. 2A in accordance with some embodiments. The second spacer 110b may include a III-V semiconductor with a gradient refractive indexes. The second spacer 110b may include III-V semiconductors, such as GaAs, AlGaAs, AlAs, GaN, AlGaN, AlN, InP, InAlAs, InGaAs, or a combination thereof. In some embodiments, the second spacer 110b includes AlGaAs. In some embodiments, the second spacer 110b has a second conductivity type. The second conductivity type may be an opposite type to the first conductivity type. In some embodiments, the second conductivity type is P-type. The dopant concentration of the second spacer 110b may be less than the dopant concentration of the layers in the subsequently formed second mirrors. Processes used to form the second spacer 110b may be similar to, or the same as, those used to form the first spacer 110a described previously and are not repeated herein for brevity.

Next, a second mirror 104b is formed over the second spacer 110b, as shown in FIG. 2A in accordance with some embodiments. The second mirror 104b may include third semiconductor layers 106b and fourth semiconductor layers 108b alternating stacked over the second spacer 110b. The third semiconductor layers 106b and the fourth semiconductor layers 108b may include III-V semiconductors, such as GaAs, AlGaAs, AlAs, GaN, AlGaN, AlN, InP, InAlAs, InGaAs, or a combination thereof. The third semiconductor layers 106b and the fourth semiconductor layers 108b may be made of different materials with different refractive indexes. In some embodiments, the third semiconductor layers 106b and the fourth semiconductor layers 108b have a second conductivity type. In some embodiments, the second conductivity type is P-type. The second mirror 104b may be referred to as a distributed Bragg reflector (DBR) of a second conductivity type. The light generated by the active region 112 may be reflected by the first mirror 104a and the second mirror 104b. The light may be resonated between the first mirror 104a and the second mirror 104b. Processes used to form the second mirror 104b may be similar to, or the same as, those used to form the first mirror 104a described previously and are not repeated herein for brevity.

It should be noted that, although there are two layers of the third semiconductor layers 106b and three layers of the fourth semiconductor layers 108b as shown in FIG. 2A, the number of the third semiconductor layers 106b and the fourth semiconductor layers 108b are not limited herein, depending on the demand of design.

Next, a cap layer 118 is formed over the second mirror 104b, as shown in FIG. 2A in accordance with some embodiments. The cap layer 118 may include III-V semiconductors, such as GaAs, AlGaAs, AlAs, GaN, AlGaN, AlN, InP, InAlAs, InGaAs, or a combination thereof. In some embodiments, the cap layer 118 has a second conductivity type. In some embodiments, the second conductivity type is P-type. In some embodiments, the cap layer 118 is a highly doped, which may help to form ohmic contact between the cap layer 118 and the subsequently formed contact electrode. The cap layer 118 may be formed by a low pressure chemical vapor deposition (LPCVD) process, an epitaxial growth process, other applicable methods, or a combination thereof. The epitaxial growth process may include molecular beam epitaxy (MBE), metal organic chemical vapor deposition (MOCVD), or vapor phase epitaxy (VPE).

Next, as shown in FIG. 2A, a contact electrode 120 is formed on the cap layer 118. The contact electrode 120 may include Au, Ti, Al, Pd, Pt, Cu, W, other suitable metal, its alloy, or a combination thereof. A contact electrode material may be formed on the cap layer 118 first by e-beam evaporation, resistive heating evaporation, electroplating, sputtering, physical vapor deposition (PVD), chemical vapor deposition (CVD), atomic layer deposition (ALD), another suitable method, or a combination thereof. In some embodiments, the contact electrode material is formed by e-beam evaporation. The electrode material is then patterned by a photolithography and etching process, and the contact electrode 120 is formed.

Next, a first dielectric layer 122 is conformally formed over the cap layer 118 and the contact electrode 120, as shown in FIG. 2A in accordance with some embodiments. As shown in FIG. 2A, the first dielectric layer 122 is over the second mirror 104b. The first dielectric layer 122 may be made of silicon oxide, silicon nitride, silicon oxynitride, silicon carbon nitride (SiCN), silicon oxide carbonitride (SiOCN), or a combination thereof. In some embodiments, the first dielectric layer 122 includes silicon nitride. The first dielectric layer 122 may be formed by a deposition process. The deposition process may include a CVD process (such as LPCVD, PECVD, SACVD, or FCVD), an ALD process, another applicable method, or a combination thereof. In some embodiments, the first dielectric layer 122 is deposited by a PECVD process.

Next, an outer trench 124 is formed through the first dielectric layer 122, the cap layer 118, the second mirror 104b, the second spacer 110b, the active region 112, the first spacer 110a, and stopped in the first mirror 104a, as shown in FIG. 2A in accordance with some embodiments. The outer trench 124 may be formed by performing a patterning and etching process. The patterning process may include a photolithography process and etching process. Examples of photolithography processes include photoresist coating, soft baking, mask aligning, exposure, post-exposure baking, developing the photoresist, rinsing and drying. The etching process may be a dry etching process or a wet etching process. In some embodiments, the etching process is a reactive-ion etching (RIE) using inductively coupled plasma (ICP) as etchers. In some embodiments, as shown in FIG. 2A, the first mirror 104a is exposed from the outer trench 124. Part of the first mirror 104a may be consumed due to the etching process during forming the outer trench 124. In some embodiments, the bottom surface of the outer trench 124 is below the bottom surface of the active region 112. In some embodiments, the bottom surface of the outer trench 124 is in the first mirror 104a.

As shown in FIGS. 1 and 2A, the outer trench 124 includes trench segments separated from each other in a top view. It should be noted that, although there are six trench segments of outer trench 124 as shown in FIG. 1, the number of trench segments of outer trench 124 are not limited herein, depending on the demand of design.

Figure 2B:
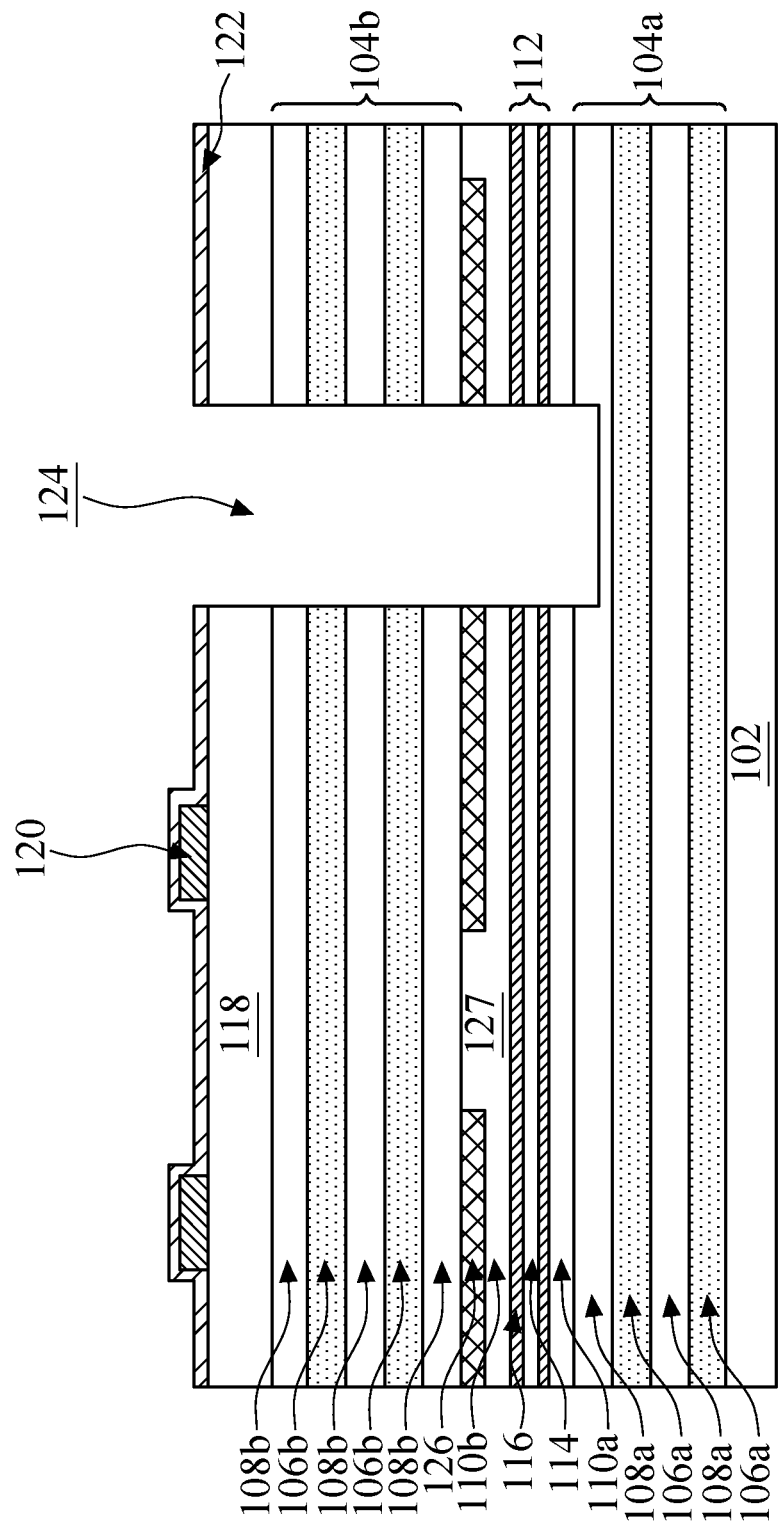

Next, as shown in FIG. 2B, the top portion of the second spacer 110b is oxidized to form an oxidation layer 126 at the top surface of the second spacer 110b. The oxidation layer 126 may be an etch stop layer 126 for a subsequent etching process. The top portion of the second spacer 110b may be Al doped layer with high Al composition. In some embodiments, the top portion of the second spacer 110b has an Al composition from about 97% to about 100%. The Al composition may affect the oxidation rate. It may be better to keep oxidation rate stable. If the Al composition is too high, Al diffusion may be too fast and it may be hard to control the position of the oxidation layer 126. If the Al composition is too less, the oxidation duration may be too long. In some embodiments, the top portion of the second spacer 110b is made of AlGaAs. The high Al composition portion of the second spacer 110b may be oxidized to form the oxidation layer 126. In some embodiments, the oxidation layer 126 includes oxides. In some embodiments, the oxidation layer 126 includes $Al_2O_3$. In some embodiments, the oxidation layer 126 is formed by a furnace oxidation process.

As shown in FIG. 2B, only a portion of the upper surface of the second spacer 110b is oxidized. In some embodiments, a central current aperture 127 is formed separating the etch stop layer 126. The central current aperture 127 may confine a current from the contact electrode 120 passing through the underlying active region 112 and the first mirror 104a.

Figure 2C:
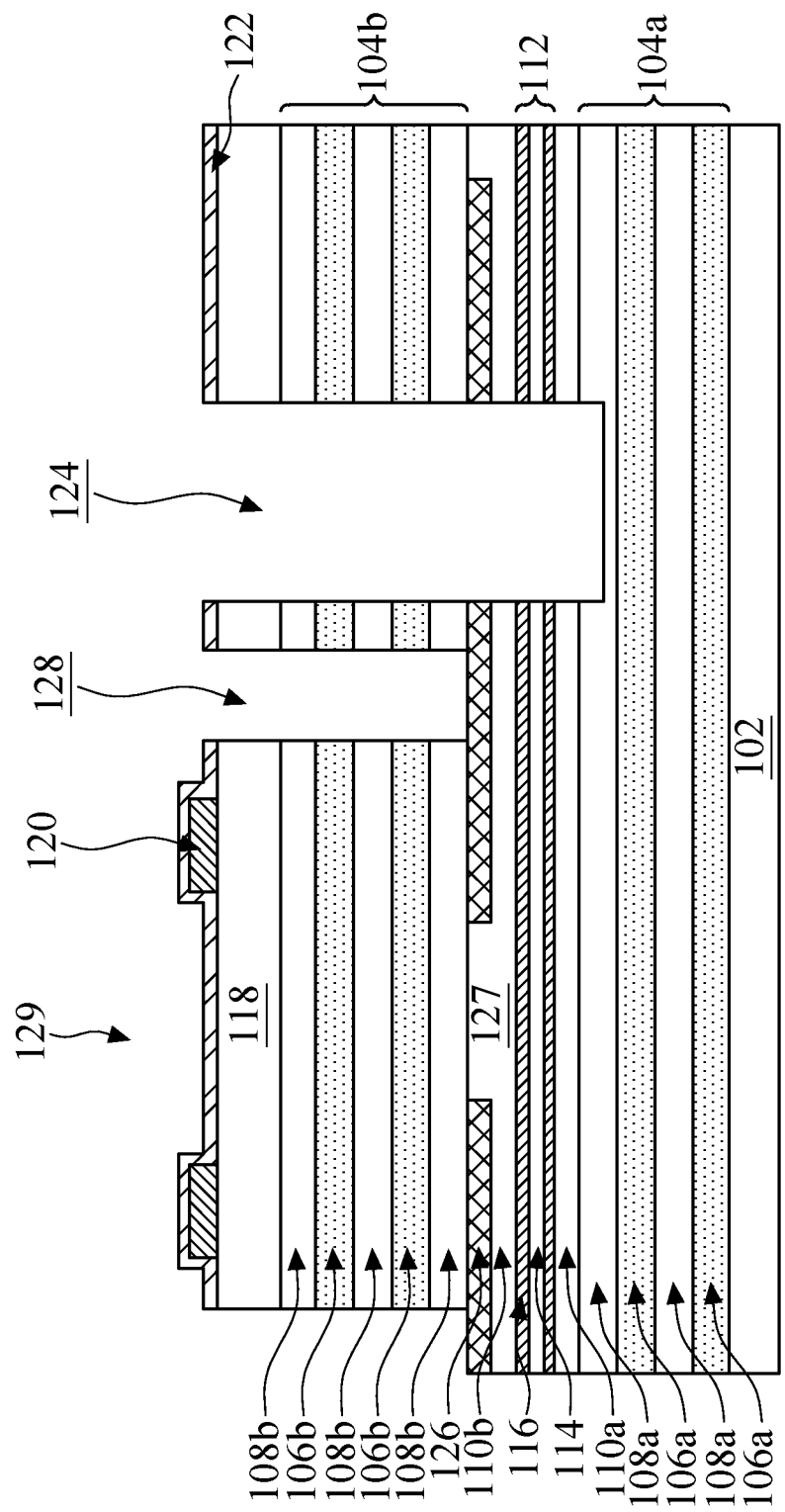

Next, an inner trench 128 is formed through the first dielectric layer 122, the cap layer 118, and the second mirror 104b, as shown in FIG. 2C in accordance with some embodiments. The inner trench 128 may be formed by performing a patterning and etching process. Processes used to form the inner trench 128 may be similar to, or the same as, those used to form the outer trench 124 described previously and are not repeated herein for brevity. In some embodiments, the inner trench 128 is formed by reactive-ion etching (ME) using inductively coupled plasma (ICP) as etchers. In some embodiments, as shown in FIG. 2C, the etching process used for forming the inner trench 128 stops on the etch stop layer 126. Therefore, the etch stop layer 126 is exposed from the inner trench 128. In some embodiments, the bottom surface of the inner trench 128 is substantially level with the top surface of the etch stop layer 126. Therefore, the depth of the inner trench 128 may be well-controlled by forming the etch stop layer 126. As shown in FIG. 2C, the depth of the inner trench 128 is less than the depth of the outer trench 124. In addition, as shown in FIG. 2C, the inner trench 128 and the outer trench 124 are separated from each other.

As shown in FIGS. 1 and 2C, a mesa 129 of the cap layer 118, the contact electrode 120, and the second mirror 104b above the central current aperture 127 is surrounded by the inner trench 128 in a top view. The mesa 129 may be surrounded by the inner trench 128. The first mirror 104a, the active region 112, the central current aperture 127, and the second mirror 104b surrounded by the inner trench 128 may be referred to as an active area 129 or an emitter area 129 of the VCSEL. The inner trench 128 may provide lateral isolation to the active area 129.

Figure 2D:
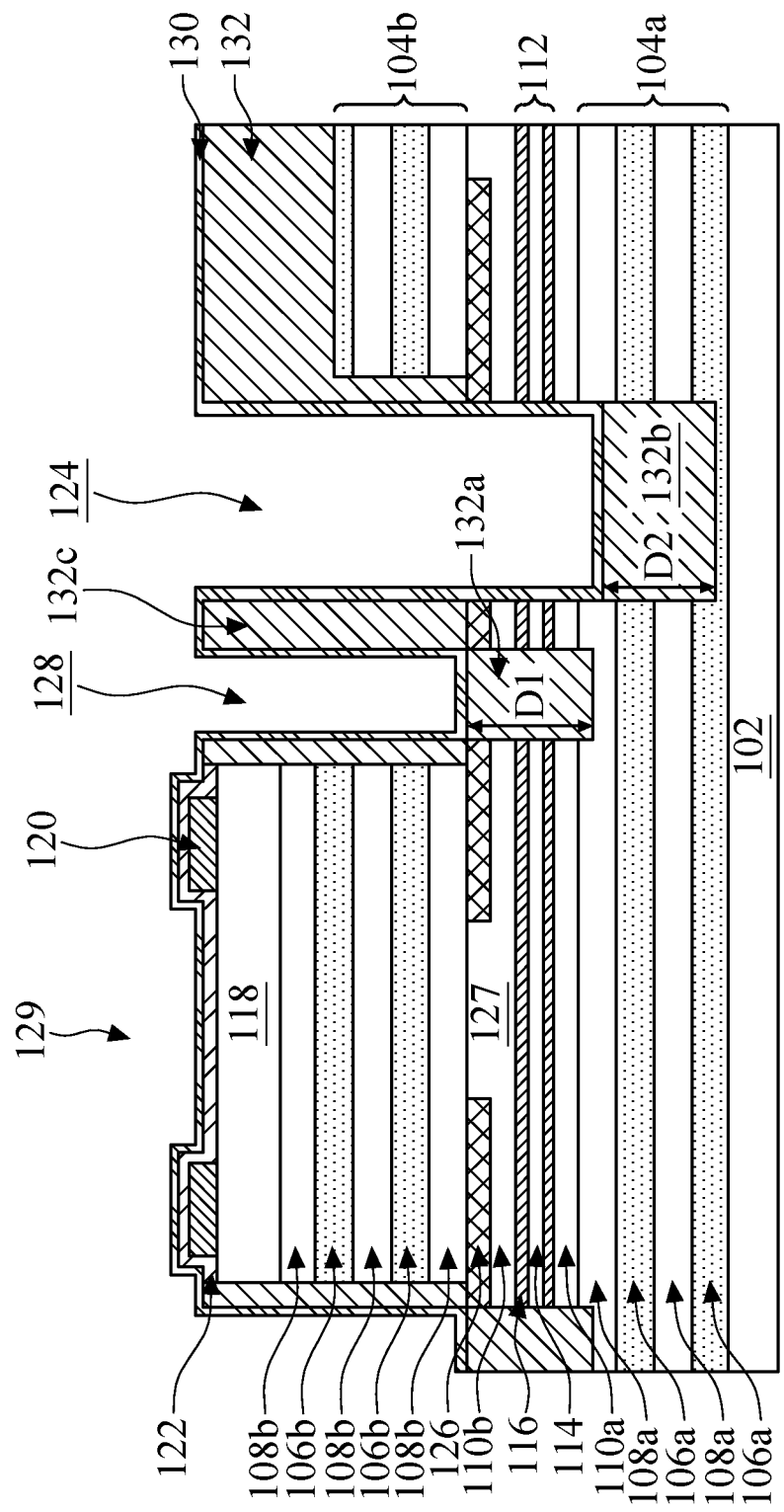

Afterwards, a second dielectric layer 130 is conformally formed over the cap layer 118, the contact electrode 120, the first dielectric layer 122, and the sidewalls and the bottom surface of the inner trench 128 and the outer trench 124, as shown in FIG. 2D in accordance with some embodiments. As shown in FIG. 2D, the second dielectric layer 130 is formed in the inner trench 128 and the outer trench 124. Processes and materials used to form the second dielectric layer 130 may be similar to, or the same as, those used to form the first dielectric layer 122 described previously and are not repeated herein for brevity. In some embodiments, the second dielectric layer 130 and the first dielectric layer 122 are made of the same materials. In some embodiments, the second dielectric layer 130 includes silicon nitride.

Next, an implantation region 132 is formed using an implantation process, as shown in FIG. 2D in accordance with some embodiments. As shown in FIG. 2D, the implantation region 132 includes a first implantation region 132a under the inner trench 128, a second implantation region 132b under the outer trench 124, and a third implantation region 132c between the inner trench 128 and the outer trench 124. In some embodiments, the first implantation region 132a, the second implantation region 132b, and the third implantation region 132c are formed in the same implantation process. In some embodiments, the implantation region 132 is doped by Helium or Boron that will decide the implantation depth.

As shown in FIG. 2D, the bottom surface of the first implantation region 132a is below the bottom surface of the first spacer 110a. In addition, the bottom surface of the first implantation region 132a is below the top surface of the first mirror 104a. The bottom surface of the second implantation region 132b is also below the top surface of the first mirror 104a. The first implantation region 132a may penetrate through the active region 112 for chip isolation. In some embodiments, the bottom surface of the first implantation region 132a is below the bottom surface of the active region 112.

When forming the inner trench 128 through the second mirror 104b, non-radiative recombination center may be produced near the inner trench 128. The first implantation region 132a may vertically isolate the active area 129 to reduce the effect of non-radiative recombination center. Since the inner trench 128 is in a ring shape in the top view, the implantation energy used to form the first implantation region 132a under the inner trench 128 may be lowered. With lower implant energy, a high-resistivity material may be obtained, and the leakage may be reduced. The implantation process may also be easier to control. As shown in FIG. 2D, the first implantation region 132a has a depth of about 0.60 μm to about 0.70 μm. In some embodiments, the first implantation region 132a has a depth of about 0.65 μm. In some embodiments, the first implantation region 132a has a depth of about half of the wavelength of laser light generated in the VCSEL. If the first implantation region 132a is too deep, the thickness and the spacing of the photo resistor may be too great, and the chip design may be limited. If the first implantation region 132a is too shallow, the isolation preventing the effect of non-radiative recombination center may be not enough.

In some embodiments as shown in FIG. 2D, since the first implantation region 132a and the second implantation region 132b are formed using the same mask, the depth D1 of the first implantation region 132a and the depth D2 of the second implantation region 132b are substantially the same. In addition, since the implantation is performed with a tilted angle, the sidewalls of the inner trench 128 and the outer trench 124 may be also implanted. Therefore, the third implantation region 132c is formed between the inner trench 128 and the outer trench 124. In some embodiments, the implantation has a tilted angle in a range of about 6° to about 8°. In some embodiments, the tilted angle of the implantation is about 7°. The implantation energy or source may be increased to achieve the needed implantation depth. As shown in FIG. 2D, the implantation region 132 also forms in the cap layer 118 and a portion of the second mirror 104b outside the outer trench 124.

Figure 2E:
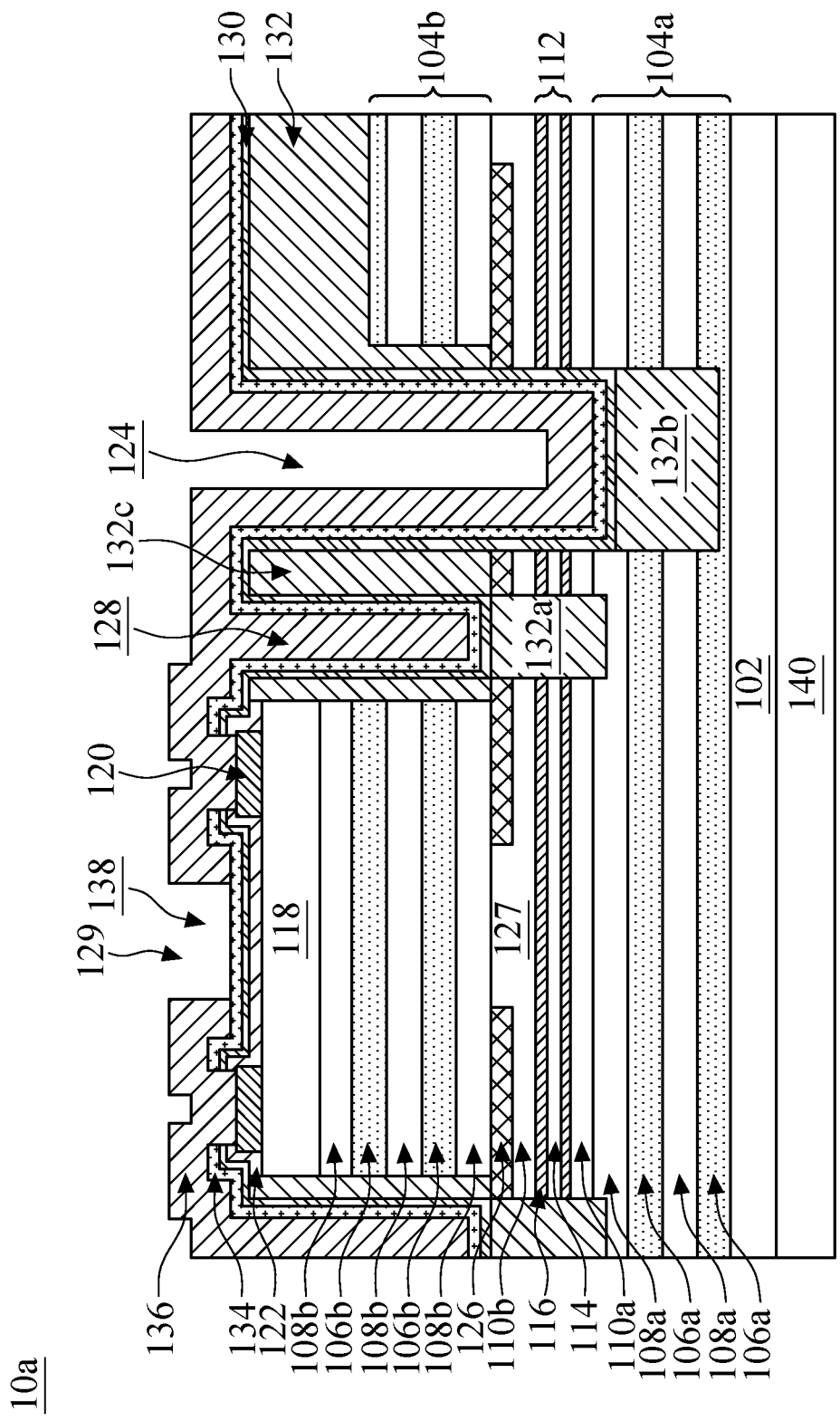

Afterwards, a third dielectric layer 134 is conformally formed over the cap layer 118, the contact electrode 120, and the sidewalls and the bottom surface of the inner trench 128 and the outer trench 124, as shown in FIG. 2E in accordance with some embodiments. As shown in FIG. 2E, the third dielectric layer 134 is formed in the inner trench 128 and the outer trench 124. Processes and materials used to form the third dielectric layer 134 may be similar to, or the same as, those used to form the first dielectric layer 122 and the second dielectric layer 130 described previously and are not repeated herein for brevity. In some embodiments, the third dielectric layer 134, the second dielectric layer 130, and the first dielectric layer 122 are made of the same materials. In some embodiments, the third dielectric layer 134 includes silicon nitride.

Next, openings (not shown) are formed through the third dielectric layer 134, the second dielectric layer 130, and the first dielectric layer 122 over the contact electrode 120. The contact electrode 120 may be exposed from the openings. The openings may be formed in third dielectric layer 134, the second dielectric layer 130, and the first dielectric layer 122 by a lithography process (e.g., coating the resist, soft baking, exposure, post-exposure baking, developing, other applicable processes, or a combination thereof), an etching process (e.g., wet etching process, a dry etching process, other applicable processes, or a combination thereof), other applicable processes, or a combination thereof.

Next, as shown in FIG. 2E, a metal layer 136 is conformally formed over the cap layer 118, the sidewalls and the bottom surface of the openings, the inner trench 128, and the outer trench 124. In some embodiments, the metal layer 136 is in direct contact with the contact electrode 120. The metal layer 136 may include conductive material such as Au, Ti, Al, Pd, Pt, Cu, W, other suitable metal, its alloy, or a combination thereof. A metal layer material may be formed by electroplating, e-beam evaporation, resistive heating evaporation, sputtering, physical vapor deposition (PVD), chemical vapor deposition (CVD), atomic layer deposition (ALD), another suitable method, or a combination thereof. In some embodiments, the metal layer 136 is formed in the electroplating process. The metal layer material is then patterned by a photolithography and etching process to form an opening 138 over the central current aperture 127 in the etch stop layer 126. The opening 138 in the metal layer 136 may be directly above the central current aperture 127 in the etch stop layer 126.

In some embodiments as shown in FIG. 2E, the inner trench 128 is filled with the metal layer 136. In some embodiments, the inner trench 128 is substantially filled up with the metal layer 136. The metal layer 136 filled in the inner trench 128 may improve VCSEL thermal dissipation.

Next, the substrate 102 is thinned to a target thickness (not shown). In some embodiments, the substrate 102 is thinned by a grinding and a polishing process. With thinner substrate 102, the thermal resistance may be reduced. Thinner wafer may improve thermal conductivity and thermal dissipation.

Next, a backside electrode 140 is formed over the backside of the substrate 102, as shown in FIG. 2E in accordance with some embodiments. The backside electrode 140 may be a metal layer. The backside electrode 140 may include Au, Ti, Al, Pd, Pt, Cu, W, other suitable metal, its alloy, or a combination thereof. A backside electrode 140 may be formed on backside of the substrate 102 first by e-beam evaporation, resistive heating evaporation, electroplating, sputtering, physical vapor deposition (PVD), chemical vapor deposition (CVD), atomic layer deposition (ALD), another suitable method, or a combination thereof. In some embodiments, the backside electrode 140 is formed by e-beam evaporation.

Figure 3A:
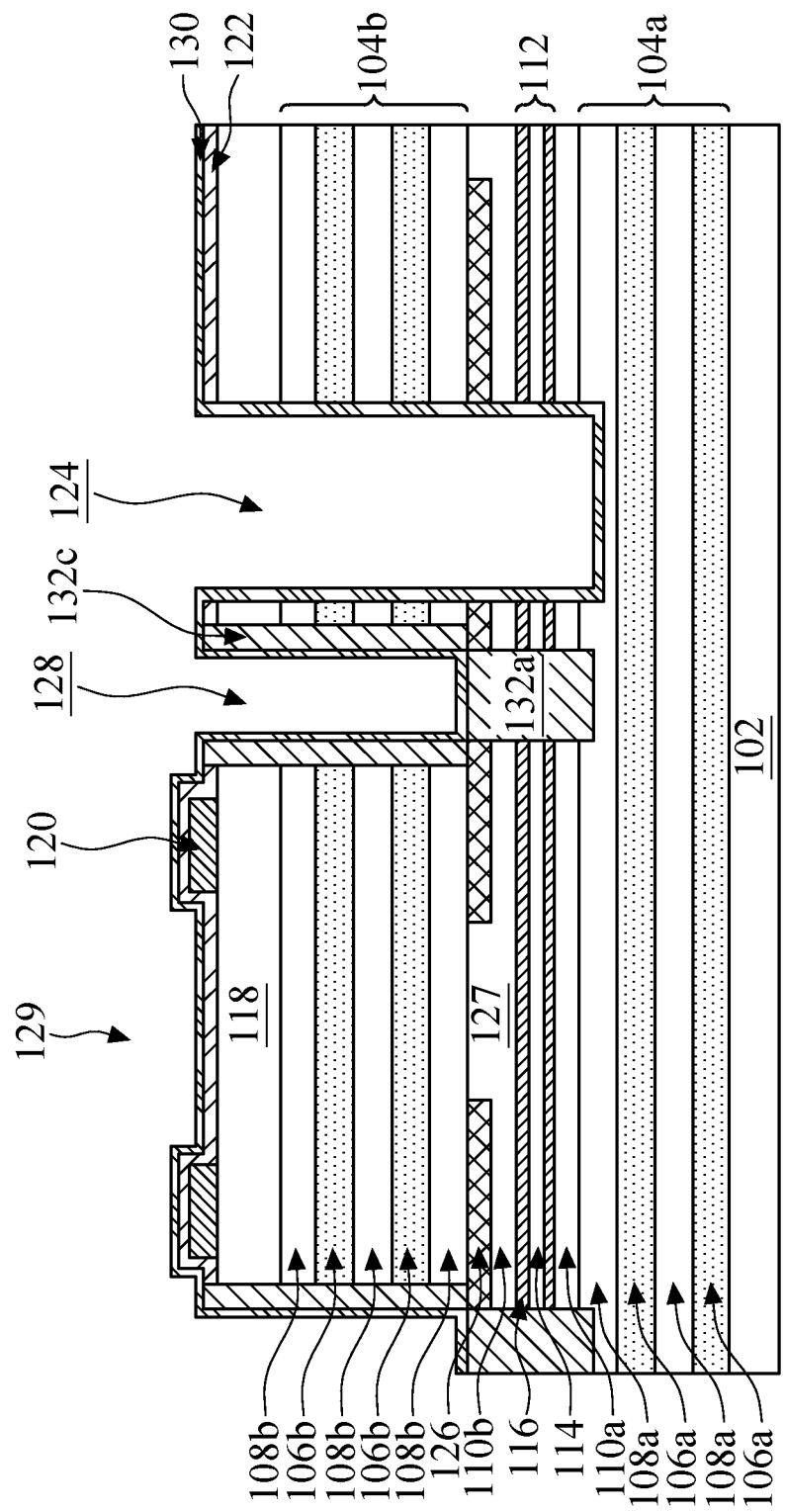
FIGS. 3A-3B are cross-sectional representations of various stages of forming a VCSEL in accordance with some other embodiments.
Figure 3B:
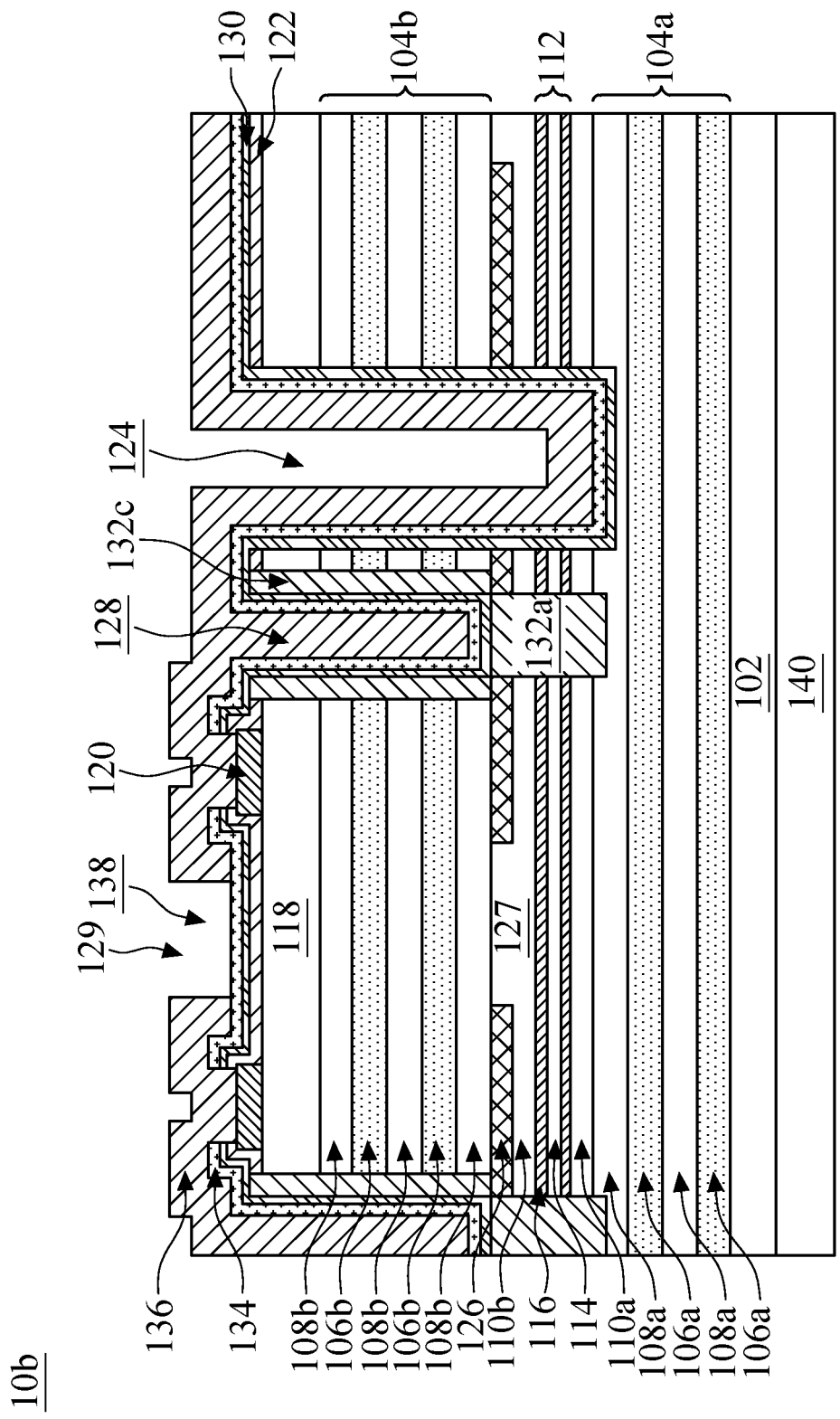

Many variations and/or modifications may be made to the embodiments of the disclosure. FIGS. 3A-3B are cross-sectional representations of various stages of forming a VCSEL 10b in accordance with some other embodiments. Some processes or devices are the same as, or similar to, those described in the embodiments above, and therefore the descriptions of these processes and devices are not repeated herein. The difference from the embodiments described above is that, as shown in FIG. 3A in accordance with some other embodiments, the implantation process and the etching of the inner trench 128 are performed using the same mask.

As shown in FIG. 3A, after forming the inner trench 128, the implantation process is performed by the same mask. Therefore, the implantation region 132 only includes the first implantation region 132a formed below the inner trench 128 and the third implantation region 132c over the sidewall of the inner trench 128. In some embodiments, the third implantation region 132c formed in a portion of the second mirror 104b between the inner trench 128 and the outer trench 124. Since the bottom surface of the first implantation region 132a is lower than the active region 112, the active area 129 is isolated from the outer area by the inner trench 128 and the first implantation region 132a. Therefore, a mask may be saved, and the cost and time required for production may be reduced.

As described above, an inner trench 128 is stopping on the oxide etch stop layer 126. The depth of the inner trench 128 may be well controlled and the uniformity within the wafer may be improved. As shown in FIG. 3B, the inner trench 128 may be filled with the metal layer 136, and the heat passivation may be improved. With the inner trench 128, the implantation region 132 may be formed by a lower implant energy, and the chip design window may be improved and the cost and time required for production may be reduced. The implantation process and the formation of the inner trench may be performed using the same mask, further reducing the cost and time required for production.

Figure 4:
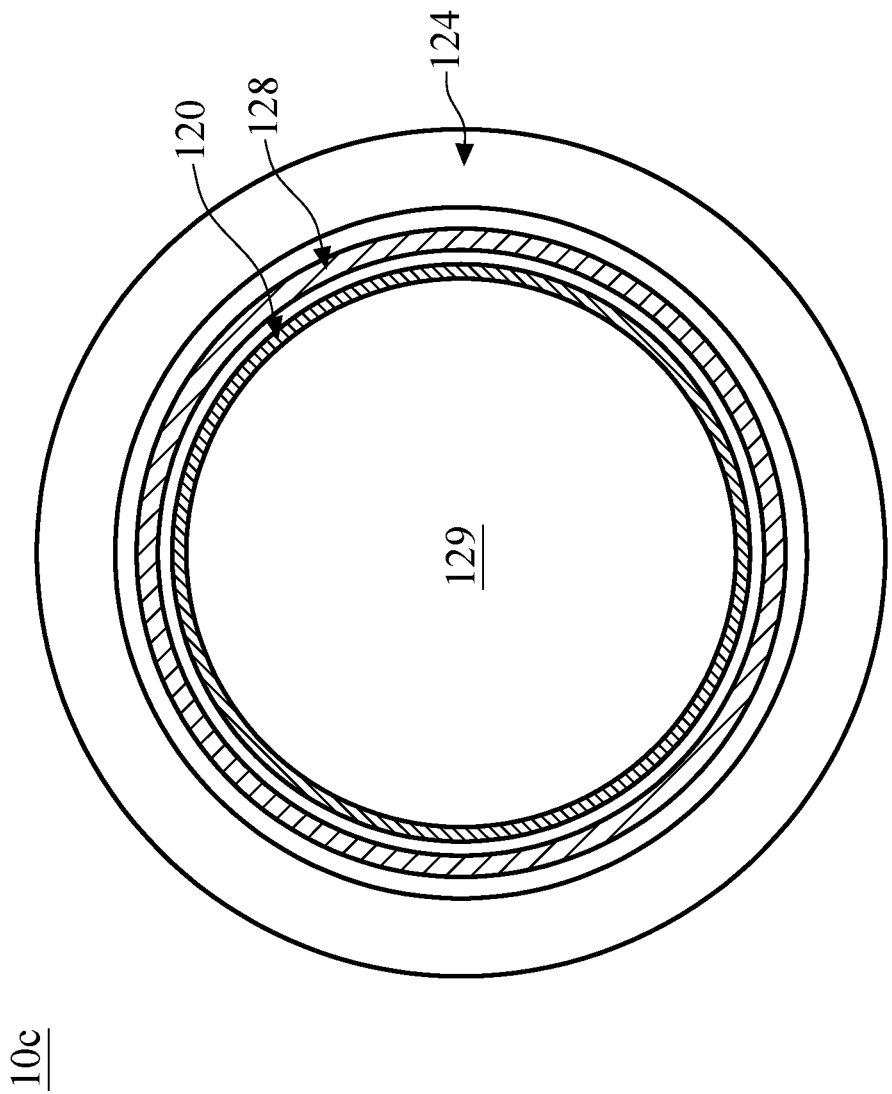
FIG. 4 is a top view of a VCSEL in accordance with some other embodiments.

Many variations and/or modifications may be made to the embodiments of the disclosure. FIG. 4 is a top view of a VCSEL 10c in accordance with some embodiments. Some processes or devices are the same as, or similar to, those described in the embodiments above, and therefore the descriptions of these processes and devices are not repeated herein. The difference from the embodiments described above is that, as shown in FIG. 4 in accordance with some other embodiments, the outer trench 124 is ring-shaped in the top view.

As long as the inner trench 128 and the first implantation region 132a may provide the isolation between the active area 129 to the outer area, the shape of the outer trench 124 in a top view may not be limited. The outer trench 124 may be ring-shaped or any other pattern that may separate the active area 129 to the outer area as long as sufficient oxidation may be provided to form an etch stop layer for the inner trench 128.

As described above, an inner trench 128 is formed stopping on the oxide etch stop layer 126. The depth of the inner trench 128 may be well controlled and the uniformity within the wafer may be improved. The inner trench 128 may be filled with the metal layer 136, and the heat passivation may be improved. With the inner trench 128, the implantation region 132 may be formed by a lower implant energy, and the chip design window may be improved and the cost and time required for production may be reduced. The shape of the outer trench 124 in the top view may not be limited, depending on the need of chip design.

Figure 5:
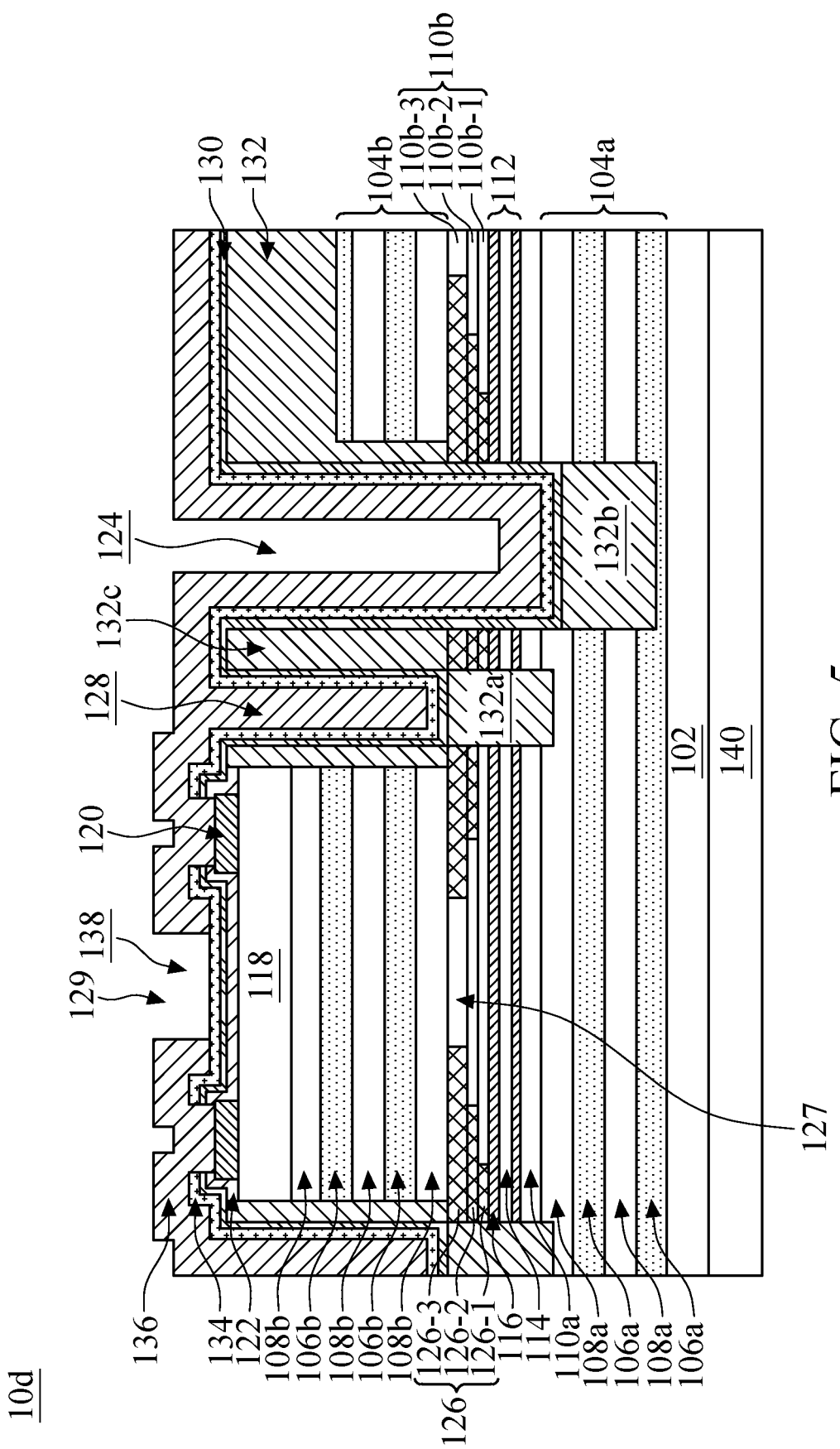
FIG. 5 is a cross-sectional representation of a VCSEL in accordance with some embodiments.

Many variations and/or modifications may be made to the embodiments of the disclosure. FIG. 5 is a cross-sectional view of a VCSEL 10d in accordance with some embodiments. Some processes or devices are the same as, or similar to, those described in the embodiments above, and therefore the descriptions of these processes and devices are not repeated herein. The difference from the embodiments described above is that, as shown in FIG. 5 in accordance with some other embodiments, the second spacer 110b may be multiple III-V semiconductor layers with different element compositions.

In some embodiments, the second spacer 110b may be multiple III-V semiconductor layers with different Al compositions. As shown in FIG. 5, the second spacer 110b includes multiple second spacer layers 110b-1, 110b-2, and 110b-3 with different Al compositions. The oxidation rate of the following oxidation process may depend on the Al compositions of the second spacer layers. The oxidation rate may be greater with higher Al composition of the second spacer layers. As shown in FIG. 5, after the oxidation process, oxidation layers 126-1, 126-2, and 126-3 are formed in the second spacer layers 110b-1, 110b-2, and 110b-3, respectively. As shown in FIG. 5, the central current apertures formed in the second spacer layers 110b-1, 110b-2, and 110b-3 have different widths. Second spacer layers 110b-1, 110b-2, and 110b-3 with higher Al content may have narrower central current apertures.

It should be noted that, although there are three layers of the oxidation layers 126-1, 126-2, and 126-3 as shown in FIG. 5, the number of oxidation layers are not limited herein, depending on the demand of process. In addition, although the topmost oxidation layer 126-3 has the narrowest central current aperture as shown in FIG. 5, the widths of the central current apertures in the oxidation layers 126-1, 126-2, and 126-3 are not limited herein. Each of the oxidation layers 126-1, 126-2, and 126-3 may have the narrowest central current aperture.

Next, the inner trench 128 is formed using an etching process, and the etching process stops at one of the oxidation layers 126-1, 126-2, and 126-3, as shown in FIG. 5 in accordance with some embodiments. The oxidation layers 126-1, 126-2, and 126-3 may also be referred as etch stop layers 126-1, 126-2, and 126-3.

It should be noted that, although the etching process using to form the inner trench 128 stops at the topmost oxidation layer 126-3, the oxidation layer which the etching process stops at is not limited herein. In addition, although the etching process using to form the inner trench 128 stops at the oxidation layer 126-3 with the narrowest central current aperture, the oxidation layer which the etching process stops at is not limited herein. The etching process using to form the inner trench 128 may stop at any layer of the oxidation layers 126-1, 126-2, and 126-3 formed in the second spacer layers 110*b*.

As described above, an inner trench 128 is formed stopping on the oxide etch stop layer 126. The depth of the inner trench 128 may be well controlled and the uniformity within the wafer may be improved. The inner trench 128 may be filled with the metal layer 136, and the heat dissipation may be improved. With the inner trench 128, the implantation region 132 may be formed by a lower implant energy, and the chip design window may be improved and the cost and time required for production may be reduced. The second spacer 110*b* may be multiple layers with different Al compositions, which may lead to oxidation layers with different central current aperture widths. The etching process using to form the inner trench 128 may stop at any one of the oxidation layers.

As mentioned above, in the present disclosure, a VCSEL and a method of forming a VCSEL is provided. With an extra inner trench formed over an etch stop layer, the uniformity of inner trench depth may be improved. In addition, the implantation depth of the implantation region under the inner trench may be reduced, and the design window may be improved due to a lower photo resistor. A metal layer may be filled in the inner trench, and heat passivation may also be improved. The inner trench and the implantation region may be formed using the same mask, and the cost and time required for production may be reduced.

It should be noted that although some of the benefits and effects are described in the embodiments above, not every embodiment needs to achieve all the benefits and effects.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A VCSEL, comprising:
    an active area, comprising:
        a first mirror formed over a substrate;
        an active region formed over the first mirror;
        a second mirror formed over the active region; and
        an etch stop layer with an aperture formed between the active region and the second mirror;
    an inner trench surrounding the active area in a top view;
    an outer trench formed beside the inner trench; and
    a first implantation region formed below the inner trench,
    wherein a bottom surface of the inner trench is defined by the etch stop layer.

2. The VCSEL as claimed in claim 1, wherein a bottom surface of the inner trench is substantially level with a top surface of the etch stop layer.

3. The VCSEL as claimed in claim 1, wherein the etch stop layer comprises oxides.

4. The VCSEL as claimed in claim 1, wherein a bottom surface of the first implantation region directly below the inner trench is below a top surface of the first mirror.

5. The VCSEL as claimed in claim 1, wherein a bottom surface of the outer trench is below a bottom surface of the active region.

6. The VCSEL as claimed in claim 1, further comprising:
    a second implantation region formed below the outer trench.

7. The VCSEL as claimed in claim 1, further comprising:
    a third implantation region formed in the second mirror between the inner trench and the outer trench.

8. A VCSEL, comprising:
    an active region sandwiched between a first mirror and a second mirror;
    an etch stop layer with an aperture formed between the active region and the second mirror;
    an outer trench formed through the second mirror, the etch stop layer, the active region, and the first mirror;
    an inner trench formed through the second mirror;
    a first implantation region formed under the inner trench; and
    a second implantation region formed under the outer trench,
    wherein a bottom surface of the inner trench is level with the etch stop layer.

9. The VCSEL as claimed in claim 8, wherein a depth of the inner trench is less than a depth of the outer trench.

10. The VCSEL as claimed in claim 8, wherein a depth of the first implantation region and a depth of the second implantation region are substantially the same.

11. The VCSEL as claimed in claim 8, wherein the inner trench and the outer trench are separated from each other.

12. The VCSEL as claimed in claim 8, wherein the outer trench comprises trench segments separated from each other in the top view.

13. The VCSEL as claimed in claim 8, wherein the outer trench is ring-shaped in the top view.

14. A method for forming a VCSEL, comprising:
    forming a first mirror over a substrate;
    forming an active region over the first mirror;
    forming a second mirror over the active region;
    forming an outer trench in the first mirror, the active region, and the second mirror;
    oxidizing a spacer layer between the active region and the second mirror to form an etch stop layer with an aperture;
    forming an inner trench stopped directly on the etch stop layer; and
    forming a first implantation region under the inner trench.

15. The method for forming the VCSEL as claimed in claim 14, wherein a bottom surface of the outer trench is in contact with the first mirror.

16. The method for forming the VCSEL as claimed in claim 14, further comprising:
 forming a second implantation region under the outer trench,
 wherein a depth of the first implantation region and a depth of the second implantation region are different.

17. The method for forming the VCSEL as claimed in claim 14, further comprising:
 conformally forming a metal layer in the inner trench and the outer trench;
 wherein the inner trench is filled with the metal layer.

18. The method for forming the VCSEL as claimed in claim 14, further comprising:
 depositing a first dielectric layer over the second mirror before forming the outer trench;
 conformally depositing a second dielectric layer in the outer trench and the inner trench after forming the inner trench; and
 conformally depositing a third dielectric layer in the outer trench and the inner trench after forming the first implantation region.

19. The method for forming the VCSEL as claimed in claim 18, wherein the first dielectric layer, the second dielectric layer, and the third dielectric layer are made of the same material.

\* \* \* \* \*